United States Patent
Kohashi et al.

(10) Patent No.: US 6,972,205 B2
(45) Date of Patent: Dec. 6, 2005

(54) SEMICONDUCTOR LASER DEVICE, FABRICATING METHOD THEREOF AND OPTICAL PICKUP EMPLOYING THE SEMICONDUCTOR LASER DEVICE

(75) Inventors: Ikuo Kohashi, Gojo (JP); Osamu Hamaoka, Yamatotakada (JP); Takeshi Horiguchi, Joyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/655,044

(22) Filed: Sep. 5, 2003

(65) Prior Publication Data
US 2004/0053430 A1 Mar. 18, 2004

Related U.S. Application Data

(62) Division of application No. 09/725,513, filed on Nov. 30, 2000, now Pat. No. 6,700,911.

(30) Foreign Application Priority Data

Dec. 1, 1999 (JP) .......................... 11-341653
Sep. 18, 2000 (JP) ....................... 2000-281724

(51) Int. Cl.⁷ ............................................. H01L 21/00
(52) U.S. Cl. ............................ 438/22; 438/31; 438/32
(58) Field of Search .............................. 438/22, 31, 32

(56) References Cited

U.S. PATENT DOCUMENTS

| | | | | |
|---|---|---|---|---|
| 5,016,253 A | * | 5/1991 | Kubota | 372/50 |
| 5,218,611 A | * | 6/1993 | Tanaka et al. | 372/36 |
| 5,612,258 A | * | 3/1997 | Tanaka | 438/26 |
| 6,060,729 A | * | 5/2000 | Suzuki et al. | 257/99 |
| 6,188,062 B1 | * | 2/2001 | Lee | 250/237 G |
| 6,573,114 B1 | * | 6/2003 | Shibata et al. | 438/22 |

FOREIGN PATENT DOCUMENTS

| | | |
|---|---|---|
| CN | 1129669 | 5/2002 |
| EP | 0 259 816 | 3/1988 |
| EP | 0 708 582 | 4/1996 |
| JP | 60-063981 | 4/1985 |
| JP | 63-138794 | 6/1988 |
| JP | 2-86184 | 3/1990 |
| JP | 3-106089 | 5/1991 |
| JP | 4-30588 | 2/1992 |
| JP | 5-291696 | 11/1993 |
| JP | 6-37403 | 2/1994 |
| KR | 1997-53784 | 7/1997 |

OTHER PUBLICATIONS

Korean Office Action dated Sep. 30, 2003.
U.S. Appl. No. 09/725,513, filed Nov. 30, 2000.
Chinese Office Action dated Jun. 27, 2003 (along with English Translation).
Japanese Office Action mailed May 10, 2005 (no English translation thereof).

* cited by examiner

*Primary Examiner*—W. David Coleman
*Assistant Examiner*—Khiem D. Nguyen
(74) *Attorney, Agent, or Firm*—Nixon & Vanderhye P.C.

(57) ABSTRACT

In a semiconductor laser device, a semiconductor laser chip is placed on a stem so that an end surface of the semiconductor laser chip, on which the main radiation side light emission point is located, protrudes from an edge of a header portion of the stem or from an edge of a header portion of a sub-mount provided on the stem so as to conceal no light emission points of the semiconductor. A conductive die bonding paste is used for the die bonding of the semiconductor laser chip. A chamfered portion or a rounded corner portion is formed at the edge of the header portion of the stem or the edge of the header portion of the sub-mount provided on the stem. Also, an optical pickup is constructed of at least the semiconductor laser device, a diffraction grating, a photodetector, a condenser lens and an object lens.

5 Claims, 8 Drawing Sheets

SEMICONDUCTOR LASER DEVICE, FABRICATING METHOD THEREOF AND OPTICAL PICKUP EMPLOYING THE SEMICONDUCTOR LASER DEVICE

This application is a divisional of application Ser. No. 09/725,513 filed Nov. 30, 2000 now U.S. Pat. No. 6,700,911, the disclosure of which is hereby incorporated herein by reference.

BACKGROUND OF THE INVENTION

The present invention relates to semiconductor laser devices, and in particular, to a semiconductor laser chip mounting structure and fabricating method and an optical pickup employing the device.

Prior art semiconductor laser devices are shown in FIG. 6 through FIG. 9, and the die bonding process of one prior art semiconductor laser device fabricating method is shown in FIGS. 10A and 10B.

In the prior art semiconductor laser device of FIG. 6, a semiconductor laser chip 50 is placed in a specified position of a header portion 51a located at an end of a stem 51 via a metal brazing material (solder or the like) 52. The semiconductor laser chip 50 is bonded by the metal brazing material 52 in the place where the chip is to be die-bonded. Therefore, in the bonding stage, the semiconductor laser chip 50 is required to be fixed by a bonding collet (not shown) or the like so that the chip does not move. In FIG. 6, an emission light optical axis 55 of the semiconductor laser device is an axis that connects a main radiation side light emission point 53 with a monitor side light emission point 54.

There are the preceding references of, for example, Japanese Patent Laid-Open Publication No. SHO 63-138794 and Japanese Patent Laid-Open Publication No. HEI 5-291696, each of which employs a metal brazing material (gold-tin alloy solder or the like) and pays attention to the size of the semiconductor laser chip and the size of a protruding portion (or a header portion) of a mount. These devices are now described with reference to FIG. 7 and FIG. 8.

Referring to FIG. 7, a prior art semiconductor laser device 60 is obtained by forming a mount 63 by mesa-etching silicon, die bonding a semiconductor laser element 61 whose active layer 62 faces the mount side to a protruding portion of the mount 63 by means of a gold-tin alloy solder 64 and bonding a gold wire 66 to a semiconductor laser element 61. A heat radiating plate 65 is provided underneath the mount 63.

As shown in FIG. 7, the semiconductor laser element 61 and the mount 63 are not put in contact with each other in the peripheral portion of the semiconductor laser element 61. Therefore, the gold-tin alloy solder 64 that oozes out of the upper surface of the protruding portion of the mount 63 in the die bonding stage of the semiconductor laser element 61 stays around the protruding portion of the mount 63 and does not rise on the side surfaces of the semiconductor laser element 61.

FIG. 8 shows a sectional view of another prior art semiconductor laser device 70. The semiconductor laser device 70 is provided with a laser chip 71 and a heat sink 72. The heat sink 72 is provided with a protruding portion 80 that has a trapezoidal cross-section shape, and the upper surface of the protruding portion 80 is slightly smaller than the lower surface of the laser chip 71 and has a flat mounting surface 72a. The laser chip 71 is mounted on the upper surface of the protruding portion 80, i.e., the mounting surface 72a via a brazing material 73.

Fabrication of this semiconductor laser device 70 includes the steps of coating a low-melting-point brazing material (Indium (In), for example) 73 on the upper surface of the protruding portion 80, performing melting with heat (temperature of 300° C.) and cooling and mounting the laser chip 71 on the protruding portion 80.

As described above, the laser chip 71 is directly die-bonded (direct bonding system) to the protruding portion 80 of the heat sink 72 by means of the brazing material 73 with interposition of no sub-mount. Therefore, the semiconductor laser device can be fabricated at low cost. The brazing material 73 pushed out of the mounting surface 72a of the heat sink 72 by the laser chip 71 creeps on the surfaces of the protruding portion 80 when melted with heat and does not rise on the side surfaces of the laser chip 71. Therefore, even when a cap layer 75 is made thin to put a light-emitting section 74 close to the heat sink 72, a laser beam L can be prevented from being diffusively reflected or partially hampered by the brazing material 73, and the radiation characteristic can be improved.

In recent years, there is a demand for improving the productivity of the semiconductor laser device fabricating method through value engineering (VE) or the like by an increase in mounting efficiency, a reduction in the number of processes and mechanization. From this standpoint, the conventional semiconductor laser devices have had the problems that much time is necessary for the heating and cooling cycles of the metal brazing material (gold-tin alloy solder or a low-melting-point brazing material In) and that the material cost of the metal brazing material is high.

As a measure for improvement, there is the semiconductor laser device shown in FIG. 9. In FIG. 9 are shown a semiconductor laser chip 50, a stem 51, a header portion 51a of the stem, a main radiation side light emission point 53, a monitor side light emission point 54 and a semiconductor laser device emission light optical axis 55 that connects the main radiation side light emission point with the monitor side light emission point. In the semiconductor laser device shown in FIG. 9, the semiconductor laser chip 50 is die-bonded by means of a conductive die bonding paste 56 employed in place of the metal brazing material 52. If the conductive die bonding paste 56 is employed, then the material cost is inexpensive, and the heating and curing of the paste can be performed after the die bonding. Therefore, if the die bonding paste 56 is employed, then there is no need for heating and cooling the semiconductor laser device in the bonding place or by means of a bonding apparatus. This enables the reduction in time of the die bonding process and the reduction in the occupation time of the bonding place (or the bonding apparatus). The die-bonded semiconductor laser device is moved to another place and subjected to the heating and cooling processes.

FIGS. 10A and 10B show the die bonding process of the aforementioned prior art semiconductor laser device fabricating method. In FIG. 10A, a specified trace quantity of conductive die bonding paste 56 is ejected from a needle tip 57 of a syringe needle of a dispenser, and the needle tip 57 of the syringe needle is moved in a downward direction 58A. The conductive die bonding paste 56 is coated in a specified position of the header portion 51a of the stem 51 by the descent of the syringe needle, and thereafter, the needle tip 57 of the syringe needle is moved in an upward direction 58B to put the syringe needle apart as shown in FIG. 10B. Subsequently, the semiconductor laser chip 50 is placed on the coated conductive die bonding paste 56.

The semiconductor laser chip 50 has a size of about 0.2 mm square, and the light emission point is located at a height of about 0.05 mm from the lower surface of the semiconductor laser chip 50. On the other hand, the needle tip 57 of the syringe needle has a diameter of about 0.3 mm. The needle tip 57 of the syringe needle should preferably be small. However, in order to reliably coat a specified quantity of conductive die bonding paste 56, the needle tip size cannot be set smaller than a diameter of about 0.3 mm.

Therefore, due to the fact that the syringe needle tip 57 has the size of a diameter of about 0.3 mm and the fact that the semiconductor laser chip 50 has the size of about 0.2 mm square, the conductive die bonding paste 56 is coated in an area broader than that of the semiconductor laser chip 50.

However, in the aforementioned prior art semiconductor laser device, the conductive die bonding paste 56 discharged from the lower surface of the semiconductor laser chip 50 has a thickness of up to about 0.05 mm in relation to the viscosity of the conductive die bonding paste. On the other hand, the light emission point of the semiconductor laser chip 50 exists at a height of about 0.05 mm from the lower surface of the semiconductor laser chip 50. Therefore, when the semiconductor laser chip 50 is die-bonded by means of the conductive die bonding paste 56, the conductive die bonding paste 56 rises on the end surfaces and the side surfaces of the semiconductor laser chip 50 as shown in FIG. 9, and this tends to cause the problem that the main radiation side light emission point 53 and the monitor side light emission point 54 are disadvantageously concealed.

Furthermore, there have lately been developed applications of optical pickups employing a semiconductor laser device, such as optical disks, and high output power lasers having an optical output of not smaller than 50 mW have been increasingly used for the optical pickups of erasable information. However, according to an optical pickup and, in particular, an optical pickup that employs a 3-beam system, return light of side beams reflecting on the chip surface, stem surface and the like of the optical pickup, exerts a bad influence. Accordingly, there has been a growing demand for eliminating the bad influence of the return light.

SUMMARY OF THE INVENTION

Accordingly, the object of the present invention is to provide a semiconductor laser device in which the conductive die bonding paste conceals neither a main radiation side light emission point nor a monitor side light emission point and the return light of the optical pickup exerts no bad influence as well as the fabricating method of the device and an optical pickup employing the device.

In order to solve the aforementioned object, the present invention provides a semiconductor laser device comprising a semiconductor laser chip placed on a stem in such a manner that an end surface of the semiconductor laser chip on which a light emission point on main radiation side is located protrudes from an edge of a header portion of the stem or from an edge of a header portion of a sub-mount provided on the stem so as to conceal no light emission points of the semiconductor, and wherein a conductive die bonding paste is employed as an adhesive for die bonding of the semiconductor laser chip.

Accordingly, there can be obtained a high-reliability high-productivity semiconductor laser device, in which the adhesive does not rise on the end surface and the side surface of the semiconductor laser chip in the die bonding stage and the trouble of concealing the main radiation side light emission point and the monitor side light emission point does not occur.

In one embodiment of the present invention, the conductive die bonding paste is applied on a rear surface of the semiconductor laser chip that is placed in such a manner as to protrude from the edge of the header portion of the stem or from the edge of the header portion of the sub-mount.

Accordingly, by providing the adhesive on the rear surface of the semiconductor laser chip in the die bonding stage, this conductive die bonding paste rigidly supports and protects the semiconductor laser chip so provided as to protrude from the edge of the header portion of the stem or the sub-mount. Therefore, a highly reliable semiconductor laser device can be obtained.

In one embodiment of the present invention, a chamfered portion or a rounded corner portion is formed at the edge of the header portion of the stem or the sub-mount provided on the stem.

Accord to the embodiment, the chamfered portion or a rounded corner portion is formed, the conductive die bonding paste does not rise on the end surface and the side surface of the semiconductor laser chip and the trouble of concealing the main radiation side light emission point and the monitor side light emission point does not occur. Furthermore, the conductive die bonding paste drooping on the chamfered portion or the like is hard to reflect light. This prevents the semiconductor laser device from being defective due to the reflection of return light and enables the obtainment of a highly reliable semiconductor laser device having a tolerance to the return light.

In one embodiment of the present invention, the light emission point of the semiconductor laser chip is located about 0.03 millimeter or more in height than a die bonding surface of the semiconductor laser chip.

Accordingly, by highly setting the height of the light emission point of the semiconductor laser chip to 0.03 millimeter or more, there can be obtained a high-reliability high-productivity semiconductor laser device, in which the conductive die bonding paste does not rise on the end surface and the side surface of the semiconductor laser chip and the trouble of concealing the main radiation side light emission point and the monitor side light emission point does not occur.

The present invention provides an optical pickup comprising the semiconductor laser device stated above, a diffraction grating and a photodetector.

Accordingly, by employing the semiconductor laser device of the present invention, the optical pickup that receives less influence from the return light of the semiconductor laser device can be obtained.

The present invention provides a method for fabricating the semiconductor laser device as stated above, comprising the step of arranging a syringe needle in such a position that a syringe needle tip partially protrudes from the edge of the header portion of the stem or from the edge of the header portion of the sub-mount provided on the stem when the conductive die bonding paste is ejected from the syringe needle tip of a dispenser so as to be coated.

According to the method for fabricating the semiconductor laser device, the adhesive does not rise on the end surface and the side surface of the semiconductor laser chip in the die bonding stage and the trouble of concealing the main radiation side light emission point and the monitor side light emission point does not occur. Therefore, there can be obtained a highly reliable semiconductor laser device.

Furthermore, by employing the conductive die bonding paste as the die bonding adhesive of the semiconductor laser chip, the material cost is less expensive than that of the metal brazing material or the like. In addition, the heating and curing of the conductive die bonding paste is allowed to be performed after the die bonding, meaning that neither heating nor cooling in the place or apparatus of die bonding is required. This enables the reduction in time of the die bonding process and the reduction in the occupation time of the bonding place (apparatus). As a result, an inexpensive high-reliability high-productivity semiconductor laser device and a fabricating method thereof can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A shows the view when a chamfered portion is provided at an end portion of a header portion, and FIG. 1B shows a view when a rounded corner portion is provided at an end portion of a header portion;

FIG. 2A is an explanatory view of a first stage of the die bonding process, FIG. 2B is an explanatory view of a second stage of the die bonding process and FIG. 2C is an explanatory view of a third stage of the die bonding process;

FIG. 4A is an explanatory view of a first stage of the die bonding process and FIG. 4B is an explanatory view of a second stage of the die bonding process;

FIGS. 10A and 10B are explanatory views of the die bonding process of the fabricating method of the prior art semiconductor laser device.

DETAILED DESCRIPTION OF THE PREFERRED EMBODIMENTS

Figure 1A:
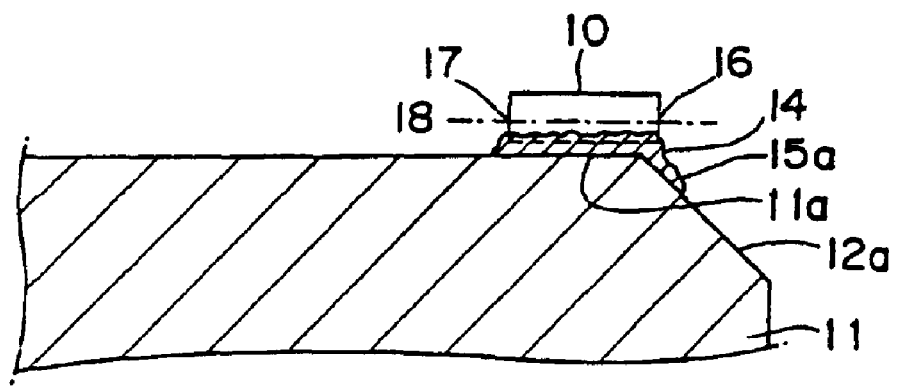
FIGS. 1A and 1B are explanatory views of a semiconductor laser device according to a first embodiment of the present invention, where
Figure 1B:
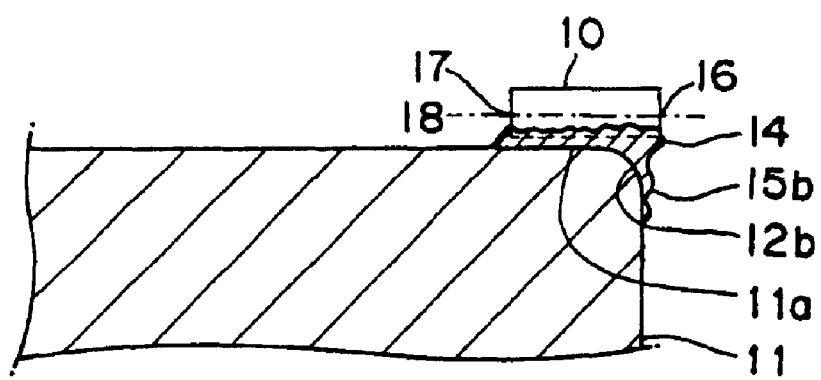
Figure 2A:
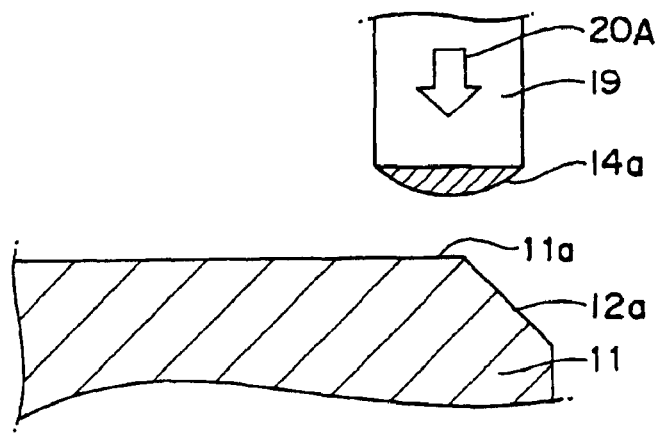
FIGS. 2A, 2B and 2C are explanatory views of a die bonding process of the semiconductor laser device fabricating method of the first embodiment of the present invention, where
Figure 2B:
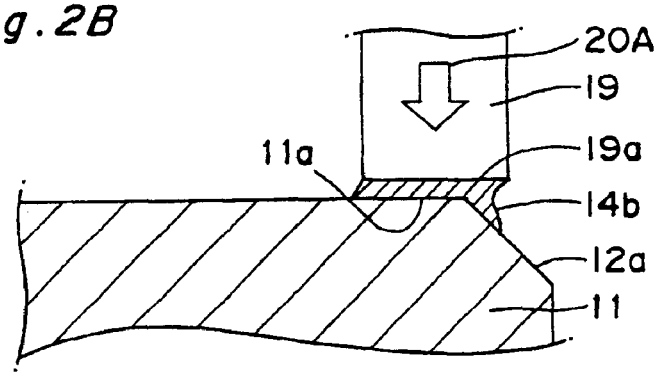
Figure 2C:
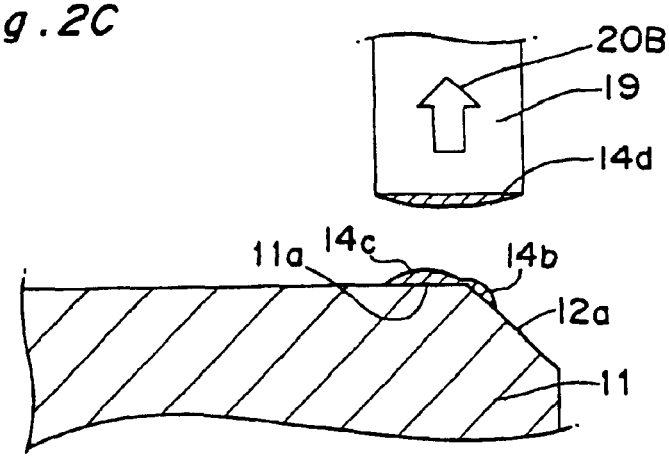
Figure 3:
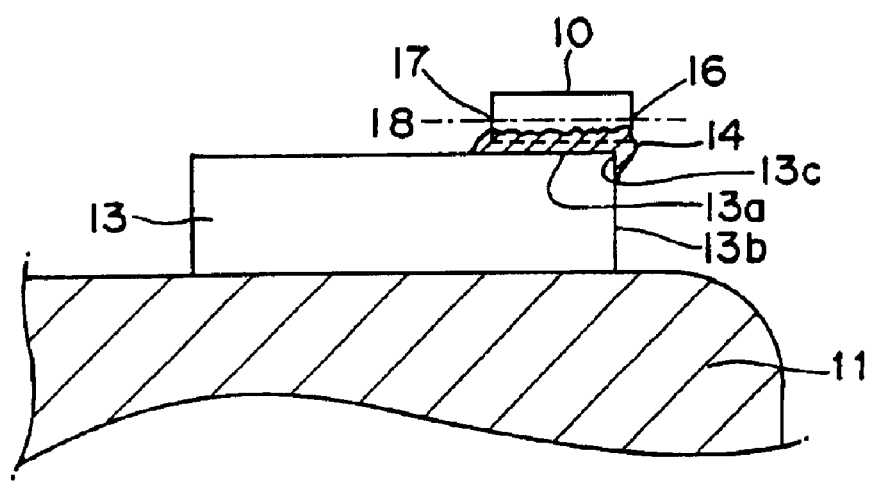
FIG. 3 is an explanatory view of a semiconductor laser device according to a second embodiment of the present invention.
Figure 4A:
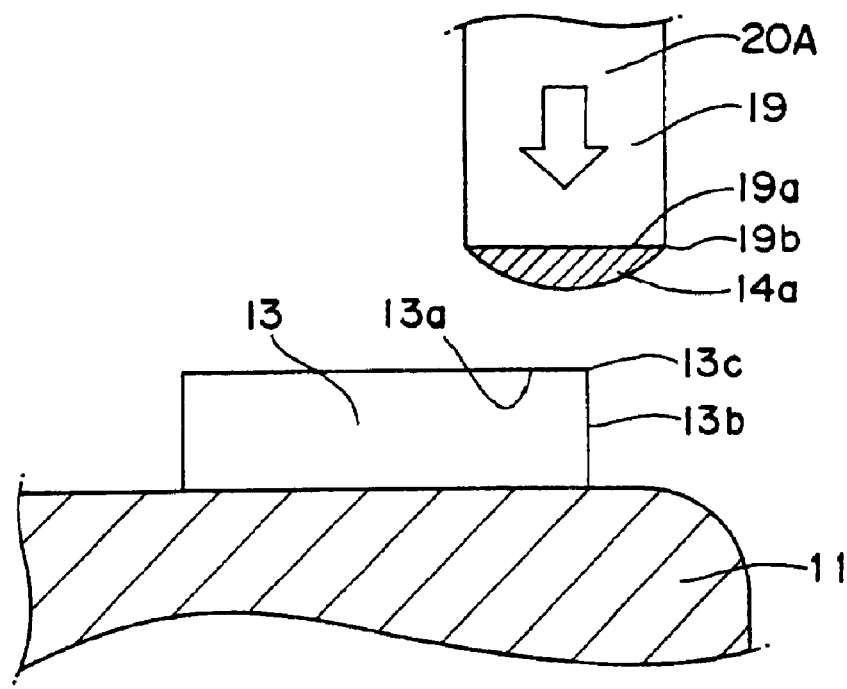
FIGS. 4A and 4B are explanatory views of a die bonding process of the semiconductor laser device fabricating method of the second embodiment of the present invention, where
Figure 4B:
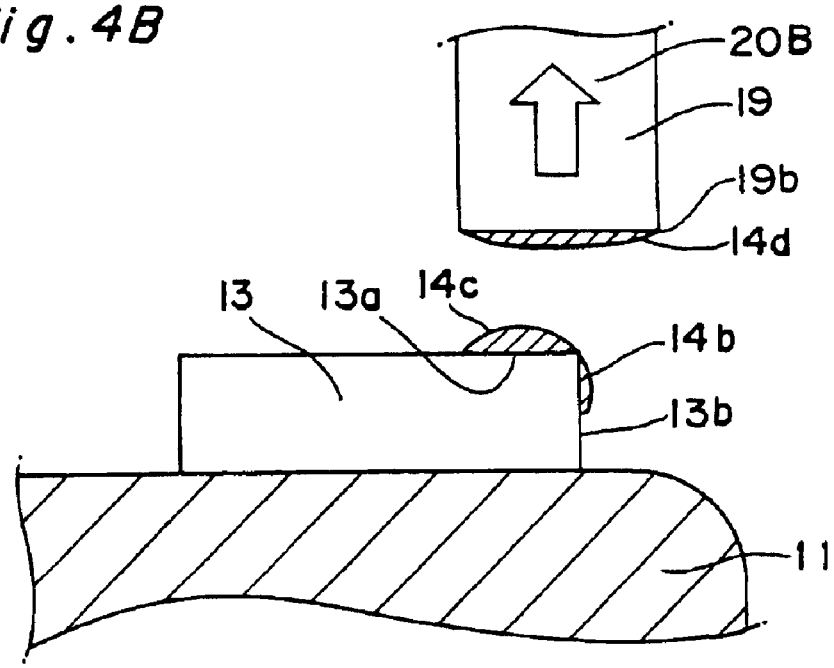
Figure 5:
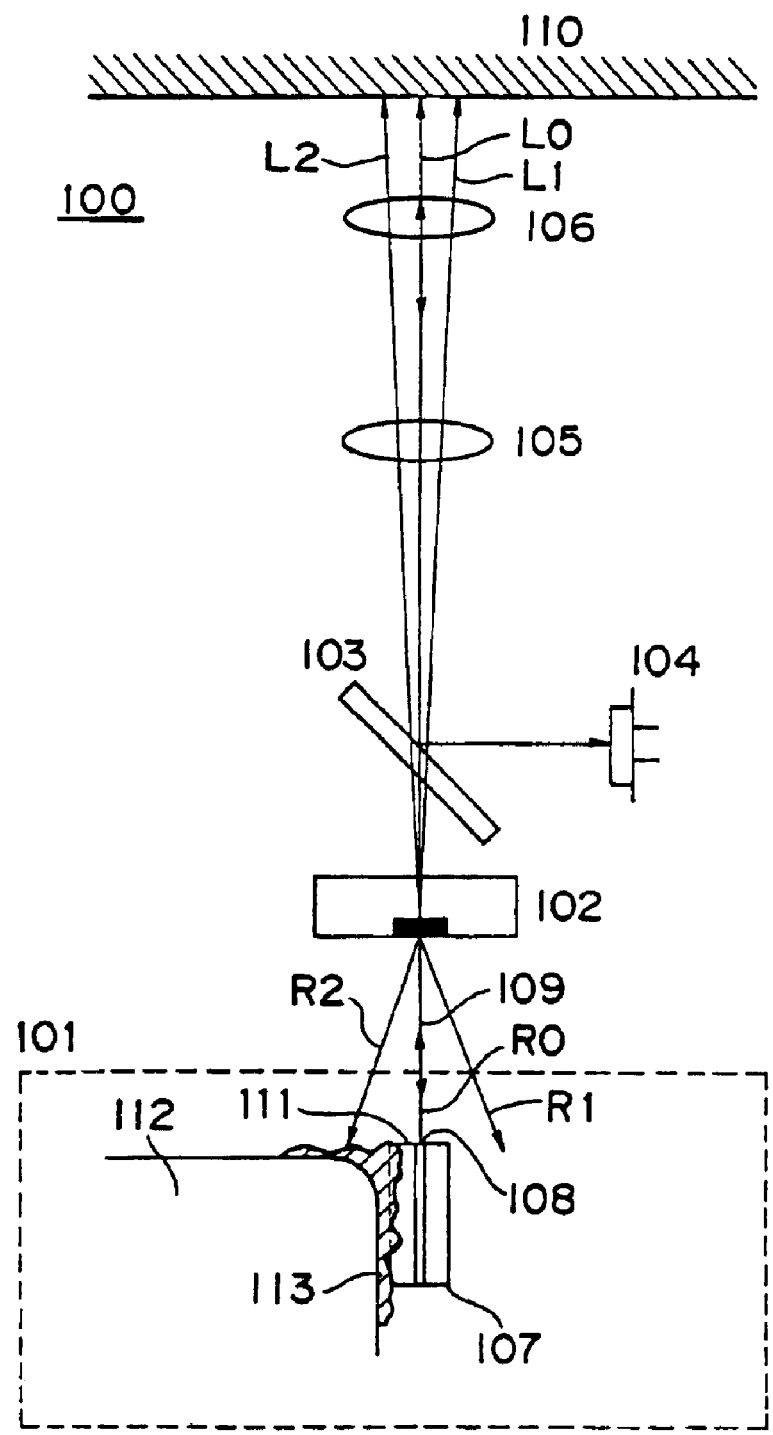
FIG. 5 is an explanatory view of an optical pickup according to a third embodiment of the present invention.
Figure 6:
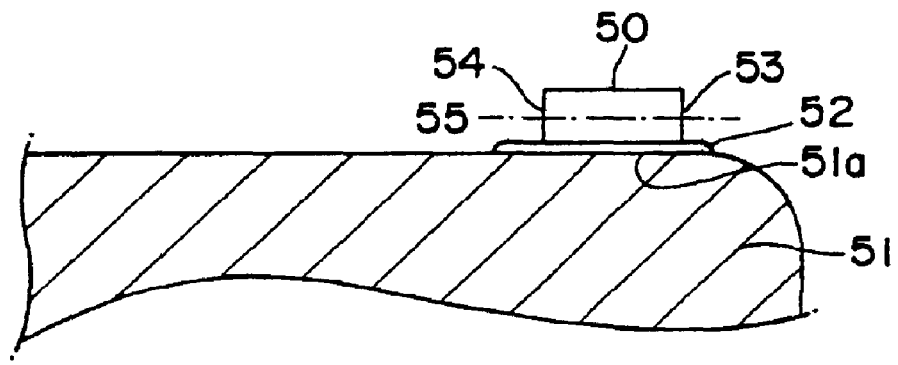
FIG. 6 is an explanatory view of a prior art semiconductor laser device.
Figure 7:
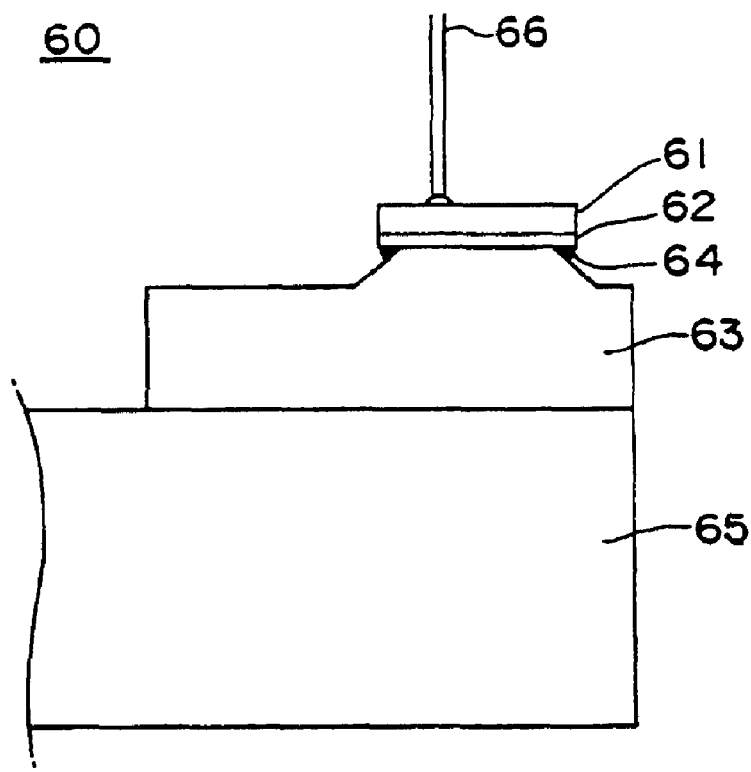
FIG. 7 is an explanatory view of a prior art semiconductor laser device.
Figure 8:
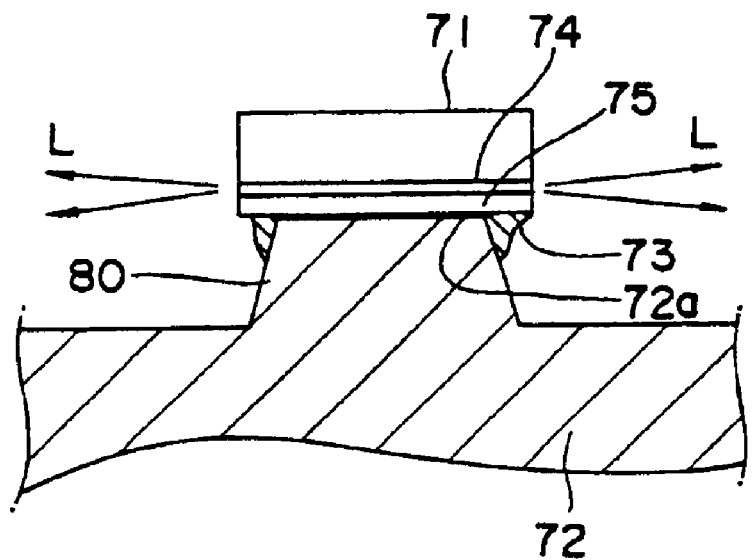
FIG. 8 is an explanatory view of a prior art semiconductor laser device.
Figure 9:
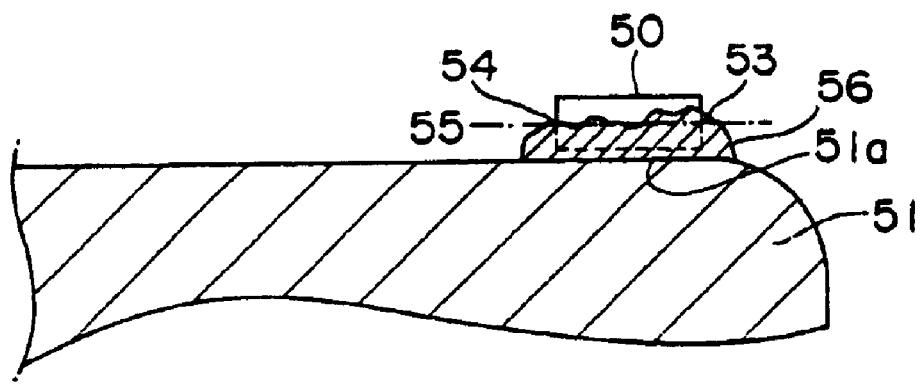
FIG. 9 is an explanatory view of a prior art semiconductor laser device.
Figure 10A:
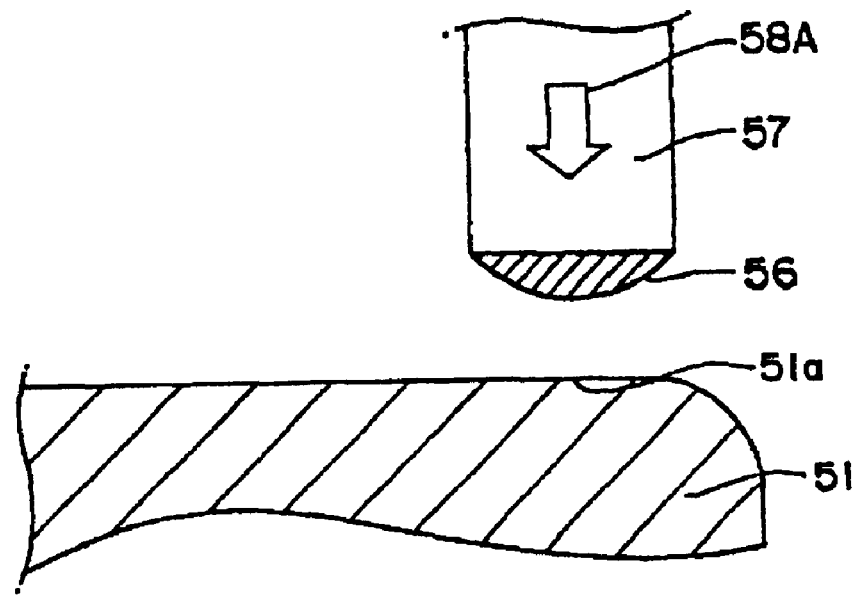
FIGS. 10A and 10B are explanatory views of the fabricating method of the prior art semiconductor laser device, where
Figure 10B:
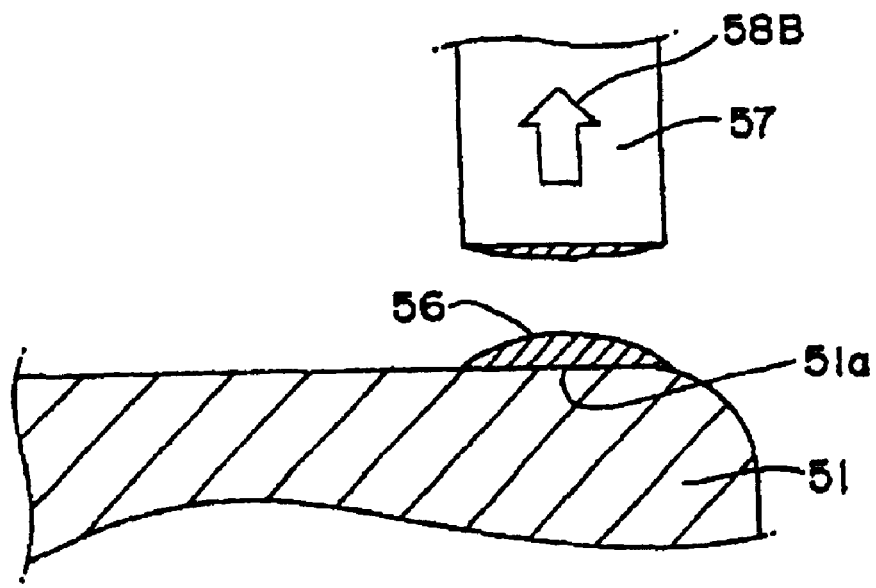

FIG. 1A through FIG. 5 show semiconductor laser devices relevant to embodiments of the present invention. FIGS. 1A and 1B are explanatory views of a semiconductor laser device according to a first embodiment of the present invention. FIGS. 2A, 2B and 2C are explanatory views of the die bonding process of the semiconductor laser device fabricating method of the first embodiment of the present invention. FIG. 3 is an explanatory view of a semiconductor laser device according to a second embodiment of the present invention. FIGS. 4A and 4B are explanatory views of the die bonding process of the semiconductor laser device fabricating method of the second embodiment of the present invention. FIG. 5 is a view of a semiconductor laser device and an optical pickup that has a diffraction grating and a photodetector, according to the present invention.

First Embodiment

In FIG. 1A are shown a semiconductor laser chip 10, a stem 11, a header portion 11a of the stem, a chamfered portion 12a provided for the header portion located at an end of the stem, a conductive die bonding paste 14, a conductive die bonding paste 15a flowed onto the chamfered portion 12a, a main radiation side light emission point 16, a monitor side light emission point 17 and an emission light optical axis 18 that connects the main radiation side light emission point with the monitor side light emission point.

In FIG. 1B are shown a rounded corner portion 12b provided for the header portion located at an end of the stem and a conductive die bonding paste 15b flowed onto the rounded corner portion 12b. The other constituent elements are identical to those of FIG. 1A, and therefore, no description is provided for them.

Referring to FIGS. 1A and 1B, the stem 11 of the semiconductor laser device is formed by processing a parent material made of an iron-based or copper-based metal alloy, and the stem 11 has undergone surface treatment of gold plating or the like. As shown in FIGS. 1A and 1B, an edge of the header portion is provided with the chamfered portion 12a or the rounded (with R: radius) corner portion 12b.

As shown in FIG. 1A, the chamfered portion 12a is provided in the header portion 11a of the stem 11, and the semiconductor laser chip 10 is bonded so as to protrude from the end portion of the header portion 11a. With this arrangement, when bonding the semiconductor laser chip 10 to the stem 11 by means of the conductive die bonding paste 14, excessive conductive die bonding paste 15a flows onto the chamfered portion 12a. Therefore, the conductive die bonding paste 15a does not rise above the level of the main radiation side light emission point 16 and the monitor side light emission point 17 located at the end surfaces of the semiconductor laser chip 10. Accordingly, the conductive die bonding paste 14 conceals neither the main radiation side light emission point 16 nor the monitor side light emission point 17 of the semiconductor laser chip 10.

As described above, this conductive die bonding paste 14 supports and protects the rear surface of the semiconductor laser chip 10 in a state in which the conductive die bonding paste 14 conceals neither the main radiation side light emission point 16 nor the monitor side light emission point 17 of the semiconductor laser chip 10. Therefore, a highly reliable semiconductor laser device can be obtained.

Furthermore, the conductive die bonding paste 15a drooping on the chamfered portion or the like is easy to diffuse light and hard to reflect light. This prevents the semiconductor laser device from being defective due to the reflection of return light and enables the obtainment of a highly reliable semiconductor laser device having a tolerance to the return light.

In the case of FIG. 1B, the rounded corner portion 12b is provided at an end of the header portion 11a of the stem 11. As shown in FIG. 1B, the semiconductor laser chip 10 is bonded so as to protrude from the end portion of the header portion 11a located at the end of the stem 11 over the rounded corner portion 12b. With this arrangement, the excessive conductive die bonding paste 15b when bonding the semiconductor laser chip 10 to the stem 11 by means of the conductive die bonding paste 14 flows onto the rounded corner portion 12b. Therefore, the conductive die bonding paste 14 does not rise above the level of the main radiation side light emission point 16 and the monitor side light emission point 17 located at the end surfaces of the semiconductor laser chip 10. Accordingly, the conductive die bonding paste 14 conceals neither the main radiation side light emission point 16 nor the monitor side light emission point 17 of the semiconductor laser chip 10.

As described above, this conductive die bonding paste 14 supports and protects the rear surface of the semiconductor laser chip 10 while concealing neither the main radiation side light emission point 16 nor the monitor side light emission point 17 of the semiconductor laser chip 10. Therefore, a highly reliable semiconductor laser device can be obtained.

Furthermore, the conductive die bonding paste 15a drooping on the chamfered portion is hard to reflect light. This arrangement accordingly enables the prevention of the semiconductor laser device from being defective as a consequence of the reflection of return light and the obtainment of a highly reliable semiconductor laser device having a tolerance to the return light.

It is to be noted that the radius of curvature of the rounded corner portion 12b differs depending on the purpose of use of the semiconductor laser device. In many cases, the radius of curvature falls within a range of about 30 to 70 $\mu$m and an average radius of curvature is about 40 to 50 $\mu$m.

FIGS. 2A, 2B and 2C are explanatory views of the die bonding process of the semiconductor laser device fabricating method of the first embodiment of the present invention.

FIG. 2A is an explanatory view of the first stage of the die bonding process, showing the descent of a dispenser syringe needle and a specified trace quantity of conductive die bonding paste discharged from the needle tip. FIG. 2B is an explanatory view of the second stage of the die bonding process, showing a state in which the syringe needle tip comes in contact with the stem and stops with the conductive die bonding paste flowing and drooping on the chamfered portion. FIG. 2C is an explanatory view of the third stage of the die bonding process, showing a state in which the syringe needle tip of the dispenser moves apart from the stem. The states of the figures are now described.

As shown in FIG. 2A, a specified trace quantity of conductive die bonding paste 14a is discharged from the dispenser syringe needle tip 19 by the dispenser. As shown in FIG. 2B, the syringe needle tip 19 is moved in the downward direction 20A, and the conductive die bonding paste 14a is made to adhere to a specified position of the header portion 11a of the stem 11.

The outermost peripheral portion of the chamfered portion of the syringe needle tip 19 is arranged outside the corner portion formed of the header portion 11a and the chamfered portion 12a.

In FIG. 2B, the chamfered portion 12a is placed at an end of the header portion 11a, and part 19a of the syringe needle tip 19 protrudes in position from the specified position of the header portion 11a located at the end of the stem 11. Therefore, part of the conductive die bonding paste 14a droops on the chamfered portion 12a and becomes a conductive die bonding paste 14b.

Subsequently, if the syringe needle tip 19 is moved in the upward direction 20B as shown in FIG. 2C, then the conductive die bonding paste 14a is transferred and coated in the specified position of the header portion 11a and becomes the conductive die bonding pastes 14b, 14c and 14d. In this case, the reference numeral 14b denotes the conductive die bonding paste flowed on the chamfered portion 12a, the reference numeral 14c denotes the conductive die bonding paste for performing die bonding and the reference numeral 14d denotes the conductive die bonding paste remaining at the syringe needle tip.

As a result, an area in which the conductive die bonding paste 14c is coated in the specified position of the header portion 11a of the stem 11 comes to have a partially cut circular shape of a diameter of 0.3 mm, which is the size of the syringe needle tip 19. That is, the area in which the conductive die bonding paste 14c is coated can be reduced in the direction in which the semiconductor laser chip 10 is die-bonded, i.e., in the radial direction of the stem 11.

As described above, according to the semiconductor laser device of the first embodiment of the present invention, by arranging the syringe needle tip 19 so that the tip partially protrude from the bonding position and providing the header portion 11a with the chamfered portion 12a, the conductive die bonding paste 14c is coated in the area smaller than that of the about 0.2-mm square semiconductor laser chip 10 located in the specified position of the header portion 11a of the stem 11.

The conductive die bonding paste 14a ejected by a trace quantity from the syringe needle tip 19 by the dispenser is coated and partially flowed on the chamfered portion 12a provided at the end of the header portion 11a, and this allows the thickness of the conductive die bonding paste 14c to be made smaller than about 0.05 mm. That is, the thickness of this conductive die bonding paste 14c has a value smaller than the average value of about 0.05 mm of the height of the light emission point of the semiconductor laser chip 10. The thickness is about 10 $\mu$m to 30 $\mu$m (0.01 mm to 0.03 mm) also depending on the viscosity of the conductive die bonding paste, the content of silver filler, the working temperature and so on.

As shown in FIGS. 1A and 1B, the semiconductor laser chip 10 to be mounted is placed on the header portion 11a in the specified position adjacent to the chamfered portion 12a, when the end surface of the main radiation side light emission point 16 is arranged so as to protrude from the corner portion by about 10 to 60 $\mu$m (preferably, about 10 to 30 $\mu$m). There is thus obtained the state in which the conductive die bonding paste 14 does not rise above the level of the main radiation side light emission point 16 and the monitor side light emission point 17 of the semiconductor laser chip 10.

Although the die bonding process in the case where the header portion shown in FIG. 1A is provided with the chamfered portion 12a has been described with reference to FIGS. 2A, 2B and 2C, the same thing can be said for the die bonding process in the case where the header portion shown in FIG. 1B is provided with the rounded corner portion 12b.

It is a matter of course that the corner portion formed of the header portion 11a and the chamfered portion 12a shown in FIG. 2A corresponds to the portion where the flat header portion shifts to the curved surface of the rounded corner portion 12b when the header portion is provided with the rounded corner portion 12b shown in FIG. 1B.

As described above, the present invention is able to obtain a high-reliability high-productivity semiconductor laser chip die bonding process and a high-reliability semiconductor laser device, in which the conductive die bonding paste 14 does not rise on the end surface and the side surface of the semiconductor laser chip 10 and the trouble of concealing the main radiation side light emission point 16 and the monitor side light emission point 17 does not occur.

Furthermore, the conductive die bonding paste (15a or 15b) drooping on the chamfered portion 12a or the rounded corner portion 12b is easy to diffuse light and hard to reflect light. This arrangement accordingly enables the prevention of the semiconductor laser device from being defective as a consequence of the reflection of return light and the obtainment of a highly reliable semiconductor laser device having a tolerance to the return light.

Second Embodiment

FIG. 3 shows a semiconductor laser device according to the second embodiment of the present invention, while FIGS. 4A and 4B show the die bonding process of the fabricating method of the device.

In FIG. 3 are shown a semiconductor laser chip 10, a stem 11, a header portion 11a of the stem 11, a sub-mount 13, a header portion 13a of the sub-mount, an end surface 13b of the sub-mount, a corner portion i.e. an edge portion 13c of the header portion 13a, a conductive die bonding paste 14, a main radiation side light emission point 16, a monitor side light emission point 17 and a semiconductor laser device emission light optical axis 18 that connects the main radiation side light emission point with the monitor side light emission point. The sub-mount 13 is formed of an Si-based wafer or a ceramic-based material of AlN, SiC or the like and is provided with an electrode pattern or a photodiode as the need arises. The sub-mount 13 is stuck and fixed in a specified position on the stem 11 by means of an adhesive such as a paste or a brazing material.

The header portion 13a located at an end of the sub-mount 13 may be provided with a chamfered portion or a rounded corner portion.

FIGS. 4A and 4B show the die bonding method of the semiconductor laser device of FIG. 3. Referring to FIG. 4A, the sub-mount 13 is stuck and fixed in a specified position on the stem 11 by means of an adhesive such as a paste or a brazing material. In this figure, the reference numeral 13c denotes the corner portion of the header portion 13a located at an end of the sub-mount 13, while the reference numeral 19b denotes the outermost portion of the periphery of the dispenser syringe needle tip 19. As shown in FIG. 4A, the part 19a of the dispenser syringe needle tip 19 protrudes from the specified position of the header portion 13a of the sub-mount 13. That is, the outermost portion 19b of the syringe needle tip 19 is arranged outside the corner portion i.e. the edge portion 13c.

As shown in FIG. 4A, a specified trace quantity of conductive die bonding paste 14a is discharged to the tip portion of the dispenser syringe needle tip 19 by means of the dispenser, and the syringe needle tip 19 is moved in the downward direction 20A. Then, although not shown, the conductive die bonding paste 14a is made to adhere to the specified position of the header portion 13a of the sub-mount 13.

As shown in FIG. 4B, if the syringe needle tip 19 is subsequently moved in the upward direction 20B, then the conductive die bonding paste 14c for die bonding use is coated on the header portion 13a of the sub-mount 13. The conductive die bonding paste 14b that has flowed down adheres to the end surface 13b of the sub-mount 13, and the remaining conductive die bonding paste 14d adheres to the syringe needle tip 19.

In FIG. 4B, the specified position of the header portion on which the semiconductor laser chip is placed is located higher than the stem 11 by the thickness of the sub-mount 13. Accordingly, part of the conductive die bonding paste 14a shown in FIG. 4A droops on the end surface 13b of the sub-mount, and the conductive die bonding paste 14b is to be thinly coated.

As a result, the area in which the conductive die bonding paste 14c is coated in the specified position of the header portion 13a comes to have a partially cut circular shape of a diameter of 0.3 mm, which is the size of the syringe needle tip 19. That is, the area in which the conductive die bonding paste 14c is coated can be reduced in the direction in which the semiconductor laser chip 10 is die-bonded, i.e., in the lengthwise direction of the sub-mount 13.

As described above, the semiconductor laser device of the second embodiment of the present invention employs the stem 11 provided with the sub-mount 13, and the syringe needle tip 19 is made partially protrude from one end of the sub-mount 13. As a result, the semiconductor laser chip 10 to be mounted is placed so that the end surface of the main radiation side light emission point protrudes from the one end of the sub-mount 13 by about 10 to 60 $\mu$m (preferably, about 10 to 30 $\mu$m), and the conductive die bonding paste 14c is accurately coated in a region whose area is smaller than the size of about 0.2 mm square of the semiconductor laser chip 10.

By virtue of the flow of part of the coated conductive die bonding paste 14a onto the end surface 13b of the sub-mount, the thickness of the conductive die bonding paste 14c located on the sub-mount can be made smaller than about 0.05 mm. That is, the conductive die bonding paste 14c is allowed to have a thickness of about 10 to 30 $\mu$m, which is smaller than the average value of about 0.05 mm of the height of the light emission point of the semiconductor laser chip 10.

The conductive die bonding paste 14b that has flowed on the end surface 13b of the sub-mount is not necessary for die bonding and causes no problem even when brought in contact with the stem 11 if the conductive die bonding paste 14b is designed to be equipotential to the stem 11.

The conductive die bonding paste 14 is made by mixing a thermosetting epoxy resin with, for example, a silver filler (silver paste). Examples of the silver filler include a filler of a needle crystal system and a filler of a flake shape. The conductive die bonding paste can also be obtained by singly using a high pyroconductive graphite powder obtained by thermally treating a polymer material containing graphite powder or carbon or together with the silver filler, mixed with a resin such as epoxy resin.

As described above, the semiconductor laser chip 10 to be mounted is placed on the sub-mount 13 so that the end surface of the main radiation side light emission point of the semiconductor laser chip 10 protrudes by about 10 to 60 $\mu$m (preferably, about 10 to 30 $\mu$m) as shown in FIG. 3. Then, there can be obtained the state in which the conductive die bonding paste 14 does not rise above the level of the main radiation side light emission point 16 and the monitor side light emission point 17 of the semiconductor laser chip 10.

As a result, according to the present invention, the conductive die bonding paste 14 does not rise on the end surface and the side surface of the semiconductor laser chip 10 and the trouble of concealing the main radiation side light emission point 16 and the monitor side light emission point 17 does not occur. Therefore, a highly reliable semiconductor laser chip die bonding method and a highly reliable semiconductor laser device can be obtained.

Third Embodiment

FIG. 5 shows an optical pickup according to the third embodiment of the present invention. The optical pickup of the present invention employs the semiconductor laser device of the present invention and includes at least the semiconductor laser device of the present invention, a diffraction grating and a photodetector.

Referring to FIG. 5, an optical pickup 100 of the present invention is constructed of the semiconductor laser device 101 of the present invention, which has been described in connection with the aforementioned first embodiment or the second embodiment, a diffraction grating 102, a beam splitter 103, a photodetector 104, a collimator lens (condenser lens) 105 and an object lens 106 provided with an actuator.

Laser light 109 emitted from the main radiation side light emission point 108 of the semiconductor laser chip 107 of the semiconductor laser device 101 is split by the diffraction grating 102 into 3-beam light comprised of zero-order light L0 (main beam), positive first-order light L1 (side beam) and negative first-order light L2 (side beam). These 3-beam light components L0, L1 and L2 are incident on a recording medium 110 such as an optical disk through the beam splitter 103, the condenser lens 105 and the object lens 106.

The zero-order light L0 (hereinafter referred to as a return light) reflected on the surface of the recording medium 110 passes through the object lens 106 and the condenser lens 105 and is then reflected on the beam splitter 103. The return light including an information signal is incident on the photodetector 104 and converted into an electric signal. The return light that has passed through the beam splitter 103 is split again by the diffraction grating 102 into zero-order return light R0 (main return light), positive first-order return light R1 (side return light) and negative first-order return light R2 (side return light).

The zero-order return light R0 returns close to the main radiation side light emission point 108 of the semiconductor laser chip. It has been known that the reflectance of the end surface of the main radiation side light emission point of the semiconductor laser chip is normally about 32% or less, and therefore, no bad influence is exerted on the 3-beam type tracking signal obtained from the photodetector 104.

The positive first-order return light R1 is diffracted outside or, precisely, about 70 μm to 120 μm outside the end surface of the main radiation side light emission point of the semiconductor laser chip of the semiconductor laser chip 107. Accordingly, the end surface on the main radiation side light emission point side of the semiconductor laser chip does not exist there, and therefore, the light R1 causes no bad influence on the photodetector 104.

On the other hand, the negative first-order return light R2, which is diffracted toward the header portion 112 located at an end of the stem (or the header portion located at an end of the sub-mount provided on the stem), is known as a factor for exerting a bad influence on the photodetector 104. However, the semiconductor laser device of the present invention is provided with the conductive die bonding paste 113 located in the vicinity of the surface to which the semiconductor laser chip 107 of the semiconductor laser device adheres and in the vicinity of the header portion of the stem.

Since the surface of the conductive die bonding paste 113 has unevenness, and therefore, the surface reflectance of light is within a range of about 9 to 24% and has a low average value of about 15%.

The semiconductor laser device of the present invention described in connection with the first embodiment or the second embodiment is placed so that the end surface of the main radiation side light emission point of the semiconductor laser chip protrudes from the edge of the header portion of the stem or from the edge of the header portion of the sub-mount provided on the stem by about 10 to 60 μm (preferably, about 10 to 30 μm), and the semiconductor laser chip is die-bonded with the conductive die bonding paste employed as an adhesive. Therefore, the occurrence of stray light due to the reflection of the negative first-order return light R2 can be suppressed.

Accordingly, the return light reflected on the conductive die bonding paste 113 does not have such intensity that causes malfunction even if the return light is reflected by the optical system and made incident as stray light on the photodetector 104.

By thus using the semiconductor laser device of the present invention, a 3-beam system optical pickup that exerts less influence on the tracking signal ascribed to the return light from the semiconductor laser device can be obtained.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A method of making a semiconductor laser device, the method comprising:
   providing a flat header portion that is to support a semiconductor laser chip;
   providing a needle for depositing conductive die-bonding paste;
   arranging the needle in depositing position so that a depositing tip of the needle partially extends laterally beyond an edge of the flat header portion when the conductive die-bonding paste is dispensed from the needle so that the conductive die-bonding paste is deposited onto both the flat header portion and an area at a lower elevation that is adjacent the edge of the flat header portion; and
   die-bonding the semiconductor laser chip to the flat header portion using the conductive die-bonding paste so that a first light emitting end of the chip extends laterally beyond the edge of the flat header portion, and a second end of the chip opposite the first end is located over the flat header portion so as to not extend beyond any edge of the flat header portion.

2. The method of claim 1, wherein the flat header portion is part of a metal or metal alloy stem.

3. The method of claim 1, wherein the flat header portion is part of a sub-mount mounted on a stem.

4. The method of claim 1, wherein an area coated with the conductive die bonding paste of the header portion has a partially cut circular shape.

5. The method of claim 1, wherein said area at a lower elevation comprises a chamfered or rounded portion which slopes downwardly from the flat header portion.

* * * * *